(12) United States Patent
Kanda

(10) Patent No.: US 6,818,539 B1
(45) Date of Patent: Nov. 16, 2004

(54) SEMICONDUCTOR DEVICES AND METHODS OF FABRICATING THE SAME

(75) Inventor: Atsushi Kanda, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/607,219

(22) Filed: Jun. 30, 2000

(30) Foreign Application Priority Data

Jun. 30, 1999 (JP) ............................................ 11-186638
May 31, 2000 (JP) ...................................... 2000-162322

(51) Int. Cl.⁷ ........................................ H01L 21/4763
(52) U.S. Cl. ...................... 438/612; 438/624; 438/640
(58) Field of Search ................................ 438/612, 637, 438/640, 738, 710, 712, 713, 622, 624

(56) References Cited

U.S. PATENT DOCUMENTS

| 4,978,420 A | * | 12/1990 | Bach | 438/624 |
| 5,433,823 A | * | 7/1995 | Cain | 156/662.1 |
| 5,470,793 A | * | 11/1995 | Kalnitsky | 438/640 |
| 5,960,306 A | * | 9/1999 | Hall et al. | 438/612 |
| 6,001,538 A | * | 12/1999 | Chen et al. | 430/316 |

FOREIGN PATENT DOCUMENTS

| JP | 62-032537 | 2/1987 | G06F/9/00 |
| JP | 63-318742 | 12/1988 | H01L/21/318 |
| JP | 01-196148 | 8/1989 | H01L/21/92 |
| JP | 02-021622 | 1/1990 | H01L/21/321 |
| JP | 05-299421 | 11/1993 | H01L/21/321 |
| JP | 06-232537 | 8/1994 | H05K/3/22 |
| JP | 07-302797 | 11/1995 | H01L/21/321 |
| JP | 10-189606 | 7/1998 | H01L/21/321 |
| JP | 10-289908 | 10/1998 | H01L/21/321 |

OTHER PUBLICATIONS

U.S. application Ser. No. 09/479,107 (filed Jan. 7, 2000).
Notice of Reasons of Rejection for Japanese Patent Application No. 2000-162322, dated Sep. 17, 2002 (from which priority is claimed for U.S. Ser. No. 09/607,219).

* cited by examiner

Primary Examiner—T. N. Quach
(74) Attorney, Agent, or Firm—Konrad, Raynes & Victor, LLP; Alan S. Raynes

(57) ABSTRACT

Embodiments include a semiconductor device comprising: a pad formed on an insulating layer and having an electric connection region with external components; and a protective insulating layer which has an aperture for exposing the electric connection region. The protective insulating layer may include a first insulating layer and a second insulating layer, and side surfaces of these insulating layers are exposed to the aperture. At least part of the side surfaces surrounding the electric connection region have a tapered configuration at an acute angle to a top surface of the pad. This semiconductor device not only enables reduction of the fabrication steps, but also provides a reliable passivation structure for a pad with sufficient thickness and stress relaxation characteristics.

26 Claims, 4 Drawing Sheets

US 6,818,539 B1

SEMICONDUCTOR DEVICES AND METHODS OF FABRICATING THE SAME

Japanese patent application no. 11-186638, filed Jun. 30, 1999, is hereby incorporated by reference in its entirety. Japanese patent application no. 2000-162322, filed May 31, 2000, is hereby incorporated by reference in its entirety.

FIELD OF THE INVENTION

The present invention relates to a pad structure of a semiconductor device, particularly to semiconductor devices having a pad on which a connection is formed, and methods of fabricating the same.

BACKGROUND

In spite of improvement of high integration of semiconductor integrated circuits and miniaturization of semiconductor chips, it has been difficult to reduce the size of a pad having a region electrically connected with the external components to a satisfactory level. This is because a pad has to be provided with a certain dimension to ensure stable electric connection with bonding wires, bumps, and the like, and to avoid a high resistance in the connecting point.

In addition, for a pad on which a bump is formed, it should be considered to keep adequate coverage for an aperture in a protective insulating layer. If there is a large and steep step around an aperture in a protective insulating layer, a barrier layer may not exhibit adequate coverage, resulting in breakage of the barrier layer.

For example, Japanese Patent Application Laid-open No. 10-189606 discloses a technique to attempt to overcome such a problem. In the technique of this patent application, a protective insulating layer formed on a metal pad of a semiconductor substrate has a connection aperture having steps for a bump of a semiconductor device. In forming such a protective insulating layer, an insulating layer on a metal pad is subjected to photo etching several times using a plurality of masks with different diameters to form an aperture having steps. Since this method requires a number of photolithography steps, a plurality of photo-masks are necessary for the photolithographic operation. As a result, although the coverage of the barrier layer is improved by this method, a cleaning step or the like is required during and prior to each photolithographic operation. This results in an undesirable increase in the number of fabrication steps and production costs.

SUMMARY

One embodiment relates to a semiconductor device including a pad which is formed on an insulating layer. The pad includes an electric connection region to connect with external components. The device includes a protective insulating layer which is formed on the insulating layer and the pad and has an aperture for exposing the electric connection region. At least part of a side surface of the protective insulating layer surrounding the electric connection region is a tapered surface with an acute angle to a top surface of the pad. The protective insulating layer includes at least first and second insulating layers, each of which has a side surface exposed to the aperture.

Another embodiment relates to a semiconductor device including a pad which is formed on an insulating layer and includes an electric connection region to connect with external components. The device includes a protective insulating layer which is formed on the insulating layer and the pad and includes an aperture over at least part of the electric connection region. A side surface of the protective insulating layer surrounding the electric connection region is a tapered surface with an acute angle to a top surface of the pad.

Another embodiment relates to a method of fabricating a semiconductor device including: forming a pad with a predetermined pattern on an insulating layer; forming a protective insulating layer on the insulating layer and over the pad by sequentially forming at least first and second insulating layers; forming a mask layer on the protective insulating layer, the mask layer having an aperture in a region corresponding to an electric connection region of the pad; and selectively etching the first and second insulating layers by using the mask layer as a mask to expose the electric connection region.

Still another embodiment relates to a method of fabricating a semiconductor device comprising: forming a pad with a predetermined pattern on an insulating layer; forming a protective insulating layer on the insulating layer over the pad; forming a mask layer on the protective insulating layer, the mask layer having an aperture in a region corresponding to an electric connection region of the pad; and patterning the protective insulating layer by isotropic etching with the mask layer as a mask to expose the electric connection region.

Another embodiment relates to a bonding pad structure including a bonding pad formed over a portion of a substrate and an insulating region formed over a portion of the bonding pad, wherein the bonding pad includes an area surrounded by and uncovered by the insulating region. The insulating region includes a side surface surrounding the uncovered area of the bonding pad, wherein at least part of the side surface is tapered and has an acute angle to a top surface of the bonding pad.

BRIEF DESCRIPTION OF THE DRAWINGS

Certain embodiments of the invention are described with reference to the accompanying drawings which, for illustrative purposes, are schematic and not necessarily drawn to scale.

DETAILED DESCRIPTION OF PREFERRED EMBODIMENTS

Figure 1:
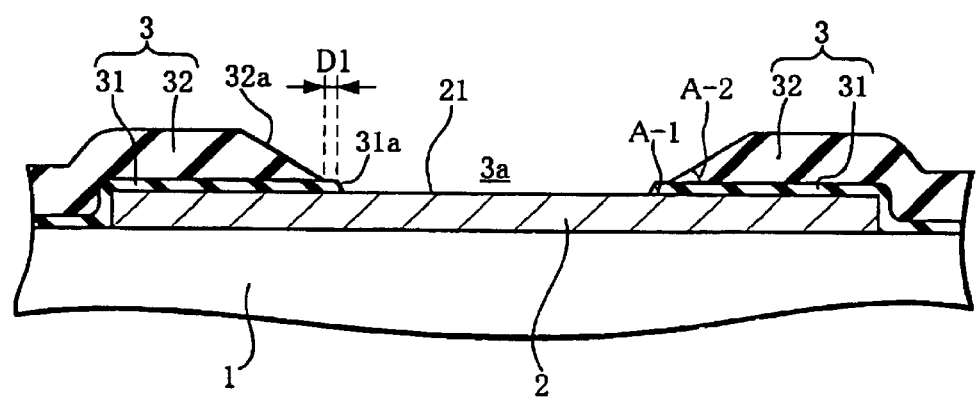
FIG. 1 is a cross-sectional view showing a passivation structure of the pad in a semiconductor device according to a first embodiment of the present invention.

Certain embodiments provide semiconductor devices which can be fabricated in a reduced number of steps by using only one mask for forming a pad that has a reliable passivation structure with a sufficient thickness and stress relaxation characteristics, as well as methods of fabricating such semiconductor devices.

According to a first embodiment of the present invention, there is provided a semiconductor device comprising a pad which is formed on an insulating layer and has an electric connection region with external components, and a protective insulating layer which is formed on the insulating layer and the pad and has an aperture for exposing the electric connection region, wherein at least part of a side surface of the protective insulating layer surrounding the electric connection region is a tapered surface with an acute angle to a top surface of the pad, and wherein the protective insulating layer has first and second insulating layers each of which has a side surface exposed to the aperture.

According to this embodiment of a semiconductor device, the protective insulating layer includes at least two insulating layers to inhibit formation of cracks and to relax stress in the protective insulating layer. In addition, since at least part of the side surface of the protective insulating layer surrounding the electric connection region is a tapered surface with an acute angle to the top surface of the pad, a barrier layer or the like can be provided with excellent coverage.

Various embodiments may include one or more of the following features.

(A) An etching rate of a material forming the first insulating layer may be different from an etching rate of a material forming the second insulating layer. As a result, the configuration of the side surfaces of the first and second insulating layers can be controlled by selecting etching conditions.

(B) The first insulating layer may be formed on the insulating layer, and the second insulating layer may be formed on the first insulating layer. The second insulating layer may be larger than the first insulating layer in thickness. For instance, the first insulating layer may have a thickness of 400 nm to 600 nm; and the second insulating layer may have a thickness of 600 nm to 1400 nm. The thickness of the first insulating layer depends on the coverage for the protective insulating layer, and the thickness of the second insulating layer depends on the strength of the protective insulating layer.

(C) At least a side surface of the second insulating layer surrounding the electric connection region may be a tapered surface with an acute angle to the top surface of the pad. A tapered angle between the side surface of the second insulating layer surrounding the electric connection region and the top surface of the pad may be smaller than a tapered angle of the first insulating layer. Coverage for the barrier layer can be improved by forming the tapered angle in this manner.

Specifically, a tapered angle between the side surface of a portion of the second insulating layer surrounding the electric connection region and the top surface of the pad may be in the range of 30° to 60°, and an angle between the side surface of a portion of the first insulating layer surrounding the electric connection region and the top surface of the pad may be in the range of 60° to 90°.

(D) The distance between an upper end of the side surface of the first insulating layer surrounding the electric connection region and a lower end of the side surface of the second insulating layer surrounding the electric connection region is preferably in the range of 0 μm to 3 μm, and more preferably 0 μm to 1 μm. The size of the pad can be decreased by setting the above distance to this range, which contributes to miniaturization of semiconductor devices. The above distance may be larger than zero, that is, the aperture in the second insulating layer may be larger than the aperture in the first insulating layer. This configuration reduces the height of steps in the aperture, which results in better coverage for the barrier layer, for example.

(E) Furthermore, a bump electrode may be formed on the electric connection region in the pad through a barrier layer. Since the protective insulating layer of the present invention can improve the coverage for the aperture when forming a thin layer such as the barrier layer, the protective insulating layer is particularly suitable for use in semiconductor devices having a bump electrode.

According to another embodiment of the present invention, there is provided a semiconductor device comprising a pad which is formed on an insulating layer and has an electric connection region with external components, and a protective insulating layer which is formed on the insulating layer and the pad and has an aperture for exposing the electric connection region, wherein a side surface of the protective insulating layer surrounding the electric connection region is a tapered surface with an acute angle to a top surface of the pad, and is exposed to the aperture.

This embodiment differs from the above in that the protective insulating layer has a single insulating layer with a tapered configuration. Embodiments of this semiconductor device may have one or more of following features.

(A) The protective insulating layer may have a thickness of 1000 nm to 2000 nm.

(B) A tapered angle between the side surface of the second insulating layer surrounding the electric connection region and the top surface of the pad may be in the range of 10° to 80°.

(C) Furthermore, a bump electrode may be provided on the electric connection region of the pad through a barrier layer.

According to a another embodiment of the present invention, there is provided a method of fabricating a semiconductor device comprising the steps of:

(a) forming a pad with a predetermined pattern on an insulating layer;

(b) forming a protective insulating layer on the insulating layer over the pad by sequentially forming at least a first and second insulating layers;

(c) forming a mask layer on the protective insulating layer, the mask layer having an aperture in a region corresponding to an electric connection region of the pad; and (d) selectively etching the first and second insulating layers by using the mask layer as a mask to expose the electric connection region.

According to this method, the number of steps as well as production costs can be reduced by etching the first and second insulating layers using a single mask. The use of a single mask does not require any alignment tolerance for a plurality of masks, thereby enabling reduction of the size of a pad. This contributes to miniaturization of the semiconductor device.

Methods of fabricating the semiconductor device of this embodiment of the present invention may have one or more of following features.

(A) The second insulating layer may be patterned by isotropic etching. The first insulating layer may be patterned by anisotropic etching. A desired tapered angle can be provided to each insulating layer by selecting a suitable etching method for the first and second insulating layers.

(B) The first and second insulating layers may be continuously patterned with the same mask layer.

According to another embodiment of the present invention, there is provided a method of fabricating a semiconductor device comprising the steps of:

(a) forming a pad with a predetermined pattern on an insulating layer;

(b) forming a protective insulating layer on the insulating layer over the pad;

(c) forming a mask layer on the protective insulating layer, the mask layer having an aperture in a region corresponding to an electric connection region of the pad; and (d) patterning the protective insulating layer by isotropic etching with the mask layer as a mask to expose the electric connection region.

The method of fabricating a semiconductor device of this embodiment of the present invention may possess various features of embodiments discussed above.

A description of embodiments of the present invention in conjunction with FIGS. 1–7 follows.

FIG. 1 is a cross-sectional view showing a pad in which a bump electrode is formed in a semiconductor device according to an embodiment of the present invention.

In this embodiment, a pad 2 containing, for example, aluminum and a passivation layer (protective insulating layer) 3 having an aperture 3a in an electric connection region 21 which functions as an electrode pad are formed on an interlayer insulation layer 1. The semiconductor device has a conventionally known layer structure (not shown in the drawings) below the interlayer insulation layer 1. This layer structure comprises, for example, a semiconductor substrate on which semiconductor elements such as a MOSFET and a bipolar transistor are formed, with at least one pair of layers, such as an interlayer insulation layer having an intercalation contact layer (such as a contact layer or via contact layer) and an insulating layer having a wiring layer formed thereon, formed on the semiconductor substrate.

The passivation layer 3 has a two-layer structure consisting of a silicon oxide layer (a first insulating layer) 31 and a silicon nitride layer (a second insulating layer) 32. The passivation layer 3 has a thickness sufficient to inhibit formation of cracks in the passivation layer 3 due to impact during a bump packaging operation and a structure to relax stress.

In this embodiment, the silicon nitride layer 32 is preferably thicker than the silicon oxide layer 31. For instance, the silicon oxide layer 31 has a preferred thickness of 400 nm to 600 nm, and the silicon nitride layer 32 has a preferred thickness of 600 nm to 1400 nm. Specifically, the silicon oxide layer 31 is made thin at a slow coating speed to ensure coverage with circuit elements having a smallest wiring rule. In contrast, the silicon nitride layer 32 is formed comparatively thickly to provide the passivation layer 3 with sufficient strength. Taking into account the strength and stress relaxation effect required for the passivation layer 3, the total thickness of the passivation layer 3 should preferably be 1200 nm or more.

In the present embodiment, a side surface 31a of the silicon oxide layer 31 and a side surface 32a of the silicon nitride layer 32, both surrounding the electric connection region 21, have a tapered configuration with an acute angle respectively to the top surface of the pad 2. The (tapered) angle A-1 of the silicon oxide layer 31 (an angle formed by the top surface of the pad 2 and the side surface 31a of the silicon oxide layer 31) differs from the tapered angle A-2 for the silicon nitride layer 32 (an angle formed by the top surface of the pad 2 and the side surface 32a of the silicon nitride layer 32).

The (tapered) angle A-1 for the silicon oxide layer 31 is preferably from 60° to 90°, and more preferably from 60° to 70°. The tapered angle A-2 for the silicon nitride layer 32 is preferably from 30° to 60°, and more preferably from 30° to 40°.

The tapered configuration of the side surfaces 31a and 32a of the silicon oxide layer 31 and the silicon nitride layer 32, or of at least the side surface 32a of the silicon nitride layer 32, ensures excellent coverage for the barrier layer (not shown in FIG. 1) which will later be formed over the electric connection region 21, silicon oxide layer 31, and silicon nitride layer 32.

In the present embodiment, the silicon nitride layer 32 has a side surface 32a at a tapered angle which is smaller than that of the silicon oxide layer 31, and is self-aligned with respect to the silicon oxide layer 31. The distance D1 between the upper end of the side surface 31a of the silicon oxide layer 31 and the lower end of the side surface 32a of the silicon nitride layer 32 is preferably 0 μm to 3 μm, and more preferably 0 μm to 1 μm. Such a small distance D1 is enabled because patterning of the aperture in the silicon oxide layer 31 and silicon nitride layer 32 is performed by etching with the same mask layer, as described later.

Patterning of the silicon oxide layer 31 and silicon nitride layer 32 using the same mask enables lithographic operation without any alignment tolerance for a plurality of masks. Therefore, a maximum area can be secured for the electric connection region 21 and the pad 2 can be made narrower.

Figure 2:
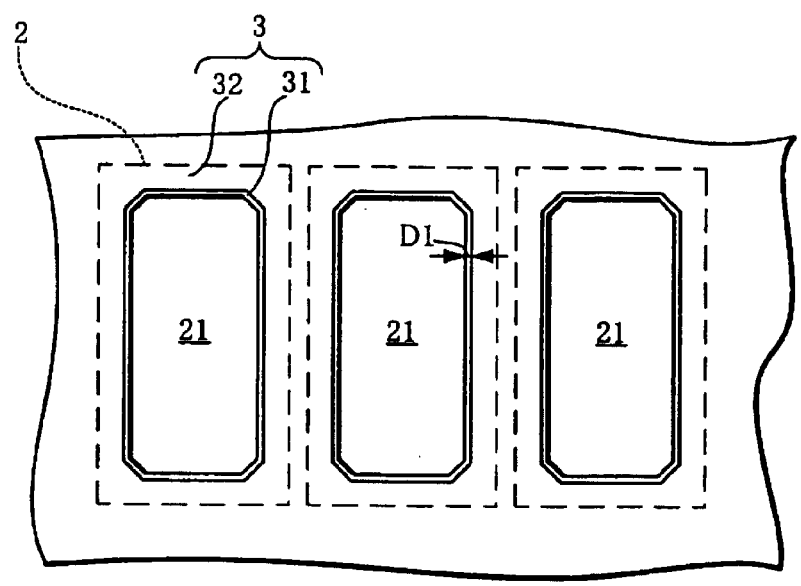
FIG. 2 is a plan view showing an arrangement of the pad in a semiconductor device according to a first embodiment of the present invention.

Specifically, as shown in the embodiment of FIG. 2, because the configuration having a plurality of pads 2 requires a fine pitch, an area for the electric connection region 21 should be provided along the longitudinal direction of the pad 2. Such a pad arrangement will be described by comparing the configuration of the embodiment shown in FIG. 2 and the configuration considering alignment tolerance for a plurality of masks as shown in FIG. 3.

Comparing the configuration of the present invention (FIG. 2) and the comparative configuration (FIG. 3), the area for the pad 2 in the electric connection region 21 in the present invention can be greater than in the electric connection region 521. Since no alignment tolerance for a plurality of masks is required when patterning the silicon oxide layer 31 and silicon nitride layer 32 with the configuration of the present invention, the pad 2 can be narrower than the comparative configuration.

Figure 3:
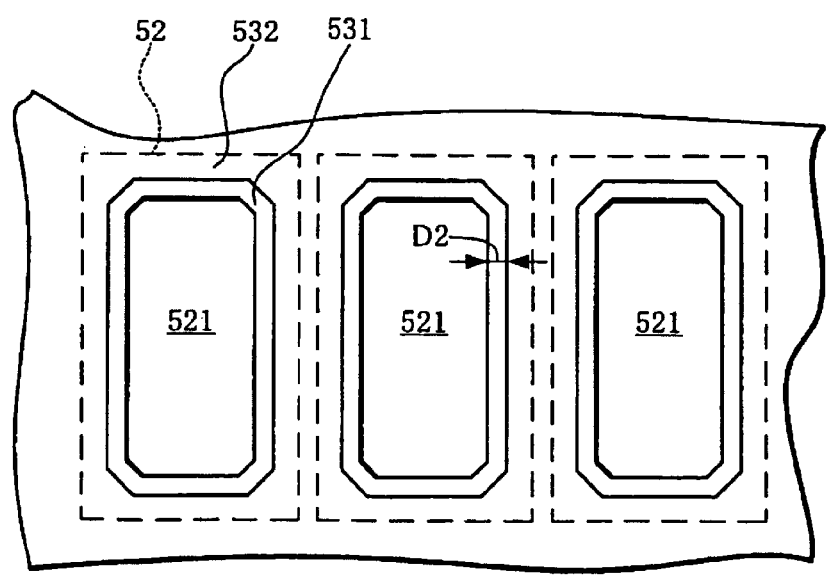
FIG. 3 is a plan view showing an arrangement of the pad in a comparative semiconductor device.

More specifically, as the silicon oxide layer (first insulating layer) 531 and the silicon nitride layer (second insulating layer) 532 are patterned by using different masks, it is required to secure the alignment tolerance for a plurality of masks, as shown in FIG. 3. For this reason, a side surface of the silicon oxide layer 531 and a side surface of the silicon nitride layer 532 are separated by a certain distance D2. The area for the pad 52 must be large corresponding to the distance D2 (usually about 10 μm). In the configuration of the present invention, however, the area for the pad 2 can be reduced by the alignment tolerance for the plurality of masks.

Consequently, the semiconductor device ensures a fine pad arrangement which is useful for high integration of semiconductor integrated circuits and a decrease in size of semiconductor chips with high reliability.

(Fabrication method)

Figure 4:
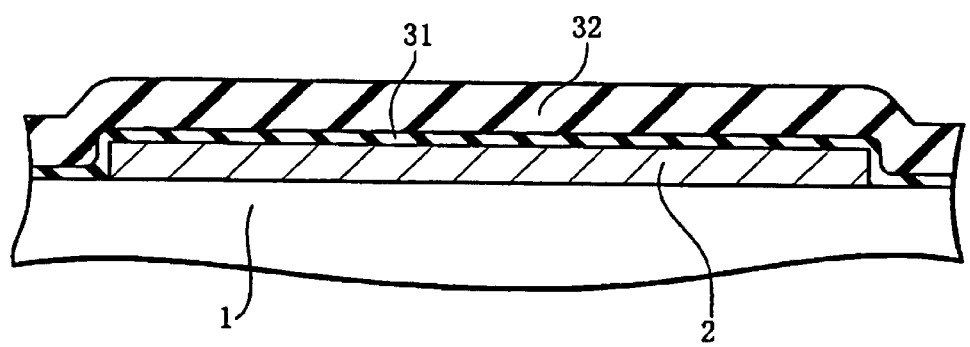
FIG. 4 is a cross-sectional view showing a method of fabricating a pad in a semiconductor device according to an embodiment of the present invention.
Figure 5:
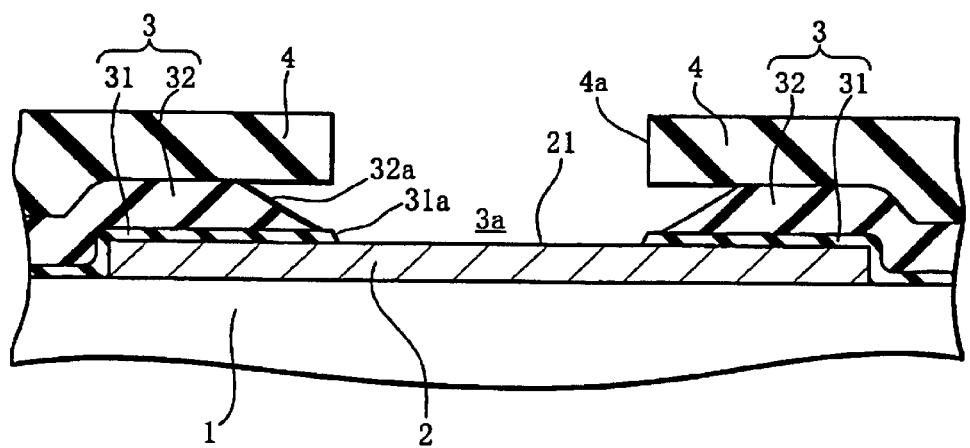
FIG. 5 is another cross-sectional view showing a method of fabricating a pad in a semiconductor device according to an embodiment of the present invention.
Figure 6:
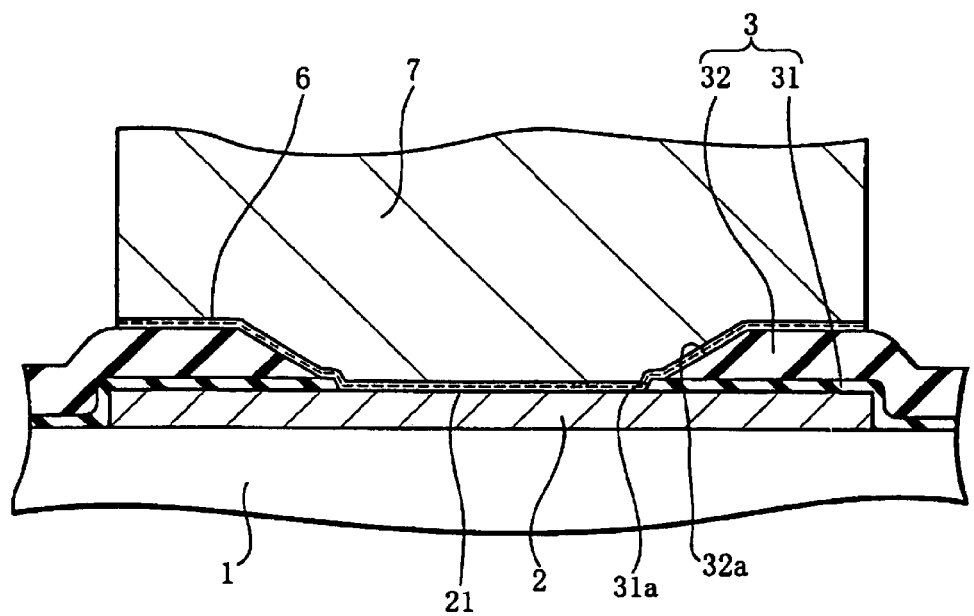
FIG. 6 is still another cross-sectional view showing a method of fabricating a pad in a semiconductor device according to an embodiment of the present invention.

FIGS. 4 to 6 are sectional views showing a method for fabricating a semiconductor device according to an embodiment of the present invention.

(1) As shown in FIG. 4, a pad 2 containing aluminum, for example, is selectively formed on the uppermost interlayer insulation layer 1. Next, the silicon oxide layer 31 and silicon nitride layer 32 are formed on the interlayer insulation layer 1 to cover the pad 2.

The silicon oxide layer 31 is formed to ensure the coverage for circuit elements possessing the smallest wiring rule using a high-density plasma CVD (Chemical Vapor Deposition) technique, for example. The silicon oxide layer 31 with a thickness of 400 nm to 600 nm is formed using a silane gas such as mono silane, oxygen, and an inert gas such as argon at a prescribed flow rate for a prescribed period of time.

The silicon nitride layer 32 is formed using a plasma CVD technique, for example. The silicon nitride layer 32 with a thickness of 600 nm to 1400 nm is formed using a silane gas such as mono silane, oxygen, and an inert gas such as argon at a prescribed flow rate for a prescribed period of time.

(2) Next, an aperture 4a is formed in a resist layer 4 with a thickness of 1,000 nm to 2,000 nm formed on the silicon nitride layer 32 in the area corresponding to the electric connection region 21 of the pad 2 using a lithographic technology as shown in FIG. 5.

Then, the silicon nitride layer 32 is patterned by isotropic etching using the resist layer 4 as a mask. Specifically, a dry etching (plasma etching) technology is used. $O_2$ and $CF_4$ are used as gases. The operation in this etching step can be controlled so as to allow the silicon oxide layer 31 to be exposed beyond the area for the aperture 4a of the resist layer 4. The silicon oxide layer 31 isotropically etched in this manner has a slanted surface (a tapered configuration) for the side surface 32a. Etching conditions are selected to provide the tapered angle of the side surface 32a for the silicon nitride layer 32 preferably from 30° to 60°, and more preferably from 30° to 40°, as mentioned above. An example of suitable etching conditions includes an RF power of 900 W, a chamber pressure of 300 mTorr, and a gas flow of 270 sccm for $CF_4$ and 35 sccm for $O_2$.

Then, immediately following etching of the silicon nitride layer 32, anisotropic etching is performed using the same resist layer 4 as a mask. Specifically, a dry etching (plasma etching) technology is used. $CHF_3$ and $CF_4$ are used together with an inert gas such as argon. Anisotropic etching conditions are selected so as to provide a (tapered) angle of the side surface 31a for the silicon oxide layer 31 in the range of 60° to 90°, and more preferably from 60° to 70°. An example of suitable etching conditions includes an RF power of 1300 W, a chamber pressure of 300 mTorr, and a gas flow of 30 sccm for $CHF_3$, 30 sccm for $CF_4$, and 600 sccm for argon.

An aperture 3a for exposing the electric connection region 21 for the bottom pad 2 is formed by the etching step.

Next, after removing the resist layer 2 using a plasma peeling technique, for example, the product is sintered at 350° C. to 450° C. for about 10 min. to 20 min. to complete a passivation structure for pad 2 as shown in FIG. 1.

In the present embodiment, the passivation layer 3 consisting of the silicon oxide layer 31 and silicon nitride layer 32 has sufficient strength and thickness.

In addition, the passivation layer 3 can be formed by one lithographic step, specifically by using a single mask (a photo-mask). As a result, not only the number of steps for the fabrication can be reduced and the production cost reduced, but also the product has high reliability even if the size is reduced.

Furthermore, although only one lithography step is performed for exposing the surface of the electric connection region 21 of the pad 2, different etching methods are used for etching different layers to avoid formation of large and steep steps in the passivation layer 3 (see process (2)). As a result, a step configuration for relaxing the step difference between the silicon oxide layer 31 and silicon nitride layer 32 can be formed, ensuring a step-less barrier layer without impairing the coverage.

(3) FIG. 6 is a cross-sectional view showing an embodiment of bump electrode formation following the steps described in FIG. 5. A barrier layer 6 is formed on the pad 2 on which the electric connection region 21 is exposed, the silicon oxide layer 31, and the silicon nitride layer 32. A bump electrode 7 is formed on barrier layer 6 according to a conventional method.

The bump electrode 7 contains gold, for example. The barrier layer 6 is formed from metals having high barrier capability and easily connected with gold, such as Ti—W, Ti—Pd, Ti—Pt, Cr, and the like. The barrier layer 6 is patterned simultaneously with the formation of the bump electrode 7.

Because the (tapered) angle A-1 of the side surface 31a for the silicon oxide layer 31 is in the range from 60° to 90° and the tapered angle A-2 of the side surface 32a for the silicon nitride layer 32 is in the range from 30° to 60° as mentioned above, a barrier layer 6 with excellent coverage can be formed without steps at a high precision. The bump electrode 7 with high reliability is obtained in this manner.

The silicon oxide layer 31 and silicon nitride layer 32 with a self-aligned step configuration can be formed by the application of the present embodiment. Therefore, a maximum area for the electric connection region 21 can be secured and a decrease in the size of pitches of the pads 2 can be ensured. This contributes to an increase in the reliability of small bump electrodes.

Figure 7:
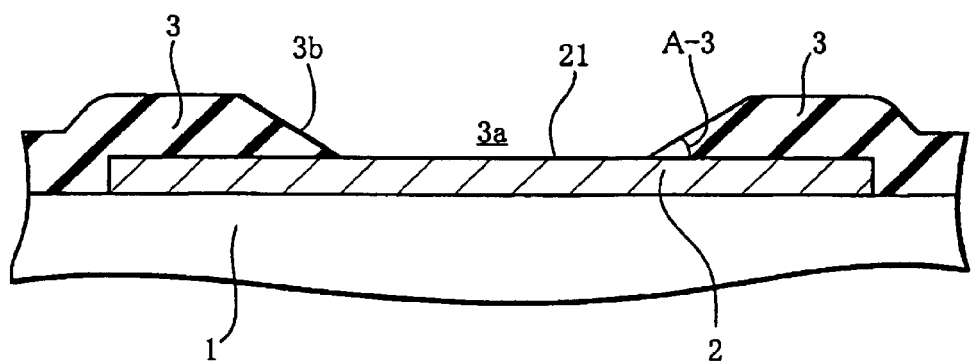
FIG. 7 is a cross-sectional view showing a passivation structure of a pad in a semiconductor device according to another embodiment of the present invention.

FIG. 7 is a cross-sectional view showing the pad in which a bump electrode is formed in the semiconductor device according to another embodiment of the present invention.

The embodiment differs from the embodiment illustrated in FIG. 1 in that the insulating layer for the passivation layer (protective insulating layer) 3 is a single layer. The same symbols are given to the parts and sections which are substantially the same as those shown in FIG. 1, and detailed descriptions for these parts and sections are omitted.

The passivation layer 3 is formed from one insulating layer. A silicon oxide layer or silicon nitride layer may be used as the insulating layer, with the silicon nitride layer being preferred in view of the strength and stress relaxation effect. The passivation layer 3 has a thickness sufficient for the passivation layer 3 to inhibit formation of cracks due to impact during a bump packaging operation and to relax stress. From this viewpoint, the thickness of the passivation layer 2 is preferably 1000 nm or more, and more preferably from 1000 nm to 2000 nm.

In the present embodiment, a side surface 3b of the passivation layer 3 surrounding an electric connection region 21 has a tapered configuration at an acute angle to a top surface of the pad 2. The tapered angle A-3 for the passivation layer 3 (an angle between the top surface of the pad 2 and the side surface 3b of the passivation layer 3) is preferably from 10° to 80°, and more preferably from 30° to 60°. The tapered configuration of the side surface 3b of the passivation layer 3 can improve the coverage for the barrier layer (not F4 shown in FIG. 7) for the same reasons as described in connection with the FIG. 1 embodiment.

In the method of fabricating the semiconductor device according to this embodiment, the passivation layer 3 is formed by patterning the insulating layer by means of isotropic etching. The isotropic etching can be performed in the same manner as the etching of the silicon nitride layer 32 in the embodiment described above.

The present invention is not limited to the above-described embodiments and many modifications and variations are possible within the scope of the present invention. For instance, the bump electrode is not necessarily limited to gold, but other metals can be used as known in the art. Although a configuration with a pad in the uppermost layer of the semiconductor device was shown in the above embodiments, the present invention can be applied to the case of forming a pad on an insulation substrate or a substrate comprising a thin insulating layer. Furthermore, the passivation layer may have a three or more layered configuration. For example, a layer such as a polyimide resin layer may be provided on the uppermost layer.

What is claimed:

1. A method for forming a semiconductor device including a bonding pad, comprising:

forming the pad;

forming a silicon oxide layer above at least the pad;

forming a silicon nitride layer above the silicon oxide layer;

forming a mask above the silicon nitride layer and providing an opening in the mask; and etching the silicon nitride layer so that a first aperture is formed in the silicon nitride layer;

etching the silicon oxide layer so that a second aperture is formed in the silicon oxide layer; and wherein the silicon nitride layer comprises a side surface surrounding the first aperture, the silicon nitride layer side surface having a tapered shape with an angle in the range of 30 degrees to 60 degrees in relation to a surface of the pad, and the silicon oxide layer comprises a side surface surrounding the second aperture, the silicon oxide layer side surface having a tapered shape with an angle in the range of 60 degrees to 70 degrees in relation to the surface of the pad, wherein the angle of the silicon nitride layer side surface having a tapered shape is smaller than the angle of the silicon oxide layer side surface having a tapered shape.

2. A method as in claim 1, wherein the etching the silicon nitride layer and the silicon oxide layer is conducted continuously.

3. A method as in claim 1, wherein the etching the silicon nitride layer includes isotropic etching and the etching the silicon oxide layer includes anisotropic etching.

4. A method as in claim 1, wherein the angle of the side surface of the silicon nitride layer is in the range of 30 to 40 degrees in relation to the surface of the pad.

5. A method as in claim 1, wherein the etching the silicon oxide layer is controlled so that the silicon oxide layer comprises an exposed upper surface portion, wherein the exposed upper surface portion extends a distance of up to 3 nm between an upper end of the side surface of the silicon oxide layer and a lower end surface of the silicon nitride layer.

6. A method as in claim 5, wherein the etching the silicon oxide layer is controlled so that the exposed upper surface portion of the silicon oxide layer is substantially parallel to the surface of the pad.

7. A method as in claim 1, further comprising:

forming a barrier layer in at least the first and second apertures, the barrier layer being positioned on: (1) the side surface of the silicon nitride layer, (2) the exposed upper surface portion of the silicon oxide layer; and (3) the side surface of the silicon oxide layer; and forming a bump electrode on the barrier layer.

8. A method as in claim 1, further comprising removing the mask layer after the etching and then heating the device at a temperature of 350° C. to 450° C.

9. A method as in claim 5, wherein the heated the device at a temperature of 350° C. to 450° C. is carried out for a time of 10 to 20 minutes.

10. A method as in claim 1, further comprising forming a polyimide resin layer on the second insulation layer.

11. A method of fabricating a semiconductor device including a bonding pad, comprising:

forming a pad;

forming a protective insulating region on the pad including first and second insulating layers, the first insulating layer being in direct contact with the pad and the second insulating layer comprising being in direct contact with the first insulation layer; the first insulating layer comprising silicon oxide, the second insulating layer comprising silicon nitride;

forming a mask layer on the protective insulating region in direct contact with a surface of the second insulating layer, the second insulating layer being positioned between the first insulating layer and the mask layer, the mask layer including an aperture in a region corresponding to an electric connection region of the pad; and dry etching the second insulating layer at the aperture in the mask so that the aperture extends into the second insulating layer;

dry etching the first insulating layer so that the aperture extends into the first insulating layer and contacts the pad;

wherein the etching is controlled so that the second insulating layer includes a side surface surrounding the aperture, the second insulating layer side surface having a tapered shape and including an angle in the range of 30 degrees to 60 degrees in relation to the surface of the conducting pad, and the first insulating layer includes a side surface surrounding the aperture, the first insulation layer side surface having a tapered shape and including an angle in relation to the surface of the conducting pad that is greater than the angle of the second insulating layer side surface.

12. A method as in claim 11, wherein the dry etching the second insulating layer is carried out using an etchant comprising $CF_4$ and $O_2$, and the dry etching the first insulating layer is carried out using an etchant comprising $CF_4$ and $CBF_3$.

13. A method as in claim 11, wherein, for the first insulating layer side surface, the angle in relation to the surface of the conducting pad of the first insulation layer side surface is in the range of 60 degrees to 70 degrees.

14. A method as in claim 11, wherein, for the second insulating layer side surface, the angle in relation to the surface of the conducting pad is in the range of 30 degrees to 40 degrees.

15. A method as in claim 11, wherein the etching is controlled so that the first insulating layer includes an upper surface portion exposed to the aperture, wherein the upper surface portion exposed to the aperture extends a distance of up to 3 nm between an upper end of the side surface of the first insulation layer and a lower end surface of the second insulation layer.

16. A method as in claim 15, wherein the etching is controlled so that the first insulating layer upper surface portion exposed to the aperture is parallel to the surface of the conducting pad.

17. A method as in claim 11, further comprising:

forming a barrier layer in the in the aperture, the barrier layer being positioned on: (1) the side surface of the second insulating layer, (2) the first insulating layer upper surface portion exposed to the aperture; and (3) the side surface of the second insulation layer; and forming a bump electrode on the barrier layer in the opening.

18. A method as in claim 11, further comprising removing the mask layer after the etching and then heating the device at a temperature of 350° C. to 450° C.

19. A method as in claim 18, wherein the heated the device at a temperature of 350° C. to 450° C. is carried out for a time of 10 to 20 minutes.

20. A method as in claim 11, further comprising forming a polyimide resin layer on the second insulation layer.

21. A method as in claim 14, wherein, for the first insulating layer side surface, the angle in relation to the surface of the conducting pad of the first insulation layer side surface is in the range of 60 degrees to 70 degrees.

22. A method for fabricating a semiconductor device including a bonding pad, comprising:

forming a pad;

forming a protective insulating region on the pad including first and second insulating layers, the first insulating layer being in direct contact with the pad and the second insulating layer comprising being in direct contact with the first insulation layer; the first insulating layer comprising silicon oxide, the second insulating layer comprising silicon nitride;

forming a mask layer on the protective insulating region in direct contact with a surface of the second insulating layer, the second insulating layer being positioned between the first insulating layer and the mask layer, the mask layer including an aperture in a region corresponding to an electric connection region of the pad; and dry etching the second insulating layer at the aperture in the mask to extend the aperture through the second insulating layer;

dry etching the first insulating layer using an etchant comprising to extend the aperture through the first insulating layer;

wherein the etching is controlled so that so that the second insulating layer includes a side surface surrounding the opening, the second insulating layer side surface having a tapered shape and including an angle in the range of 30 degrees to 60 degrees in relation to a surface of the conducting pad;

wherein the etching is controlled so that the first insulating layer includes a side surface surrounding the opening, the first insulation layer side surface having a tapered shape and including an angle in relation to the surface of the conducting pad that is greater than the angle of the second insulating layer side surface;

and wherein the etching is controlled so that the first insulating layer also includes an upper surface exposed to the aperture, wherein the first insulating layer upper surface exposed to the aperture is formed substantially parallel to the surface of the pad.

23. A method as in claim 22, wherein the etching is controlled so that the first insulating layer upper surface portion exposed to the aperture extends a distance of up to 3 nm between an upper end of the side surface of the first insulation layer and a lower end surface of the second insulation layer.

24. A method as in claim 22, further comprising:

forming a barrier layer in the in the aperture, the barrier layer being positioned on: (1) the side surface of the second insulating layer, (2) the first insulating layer upper surface portion exposed to the aperture; and (3) the side surface of the second insulation layer; and forming a bump electrode on the barrier layer in the opening.

25. A method as in claim 22, wherein, for the first insulating layer side surface, the angle in relation to the surface of the conducting pad is in the range of 60 degrees to 70 degrees; and wherein, for the second insulating layer side surface, the angle in relation to the surface of the conducting pad is in the range of 30 degrees to 40 degrees.

26. A method for forming a semiconductor including a bonding pad, comprising:

forming the pad;

forming a silicon oxide layer above at least the pad;

forming a silicon nitride layer above the silicon oxide layer;

forming a mask above the silicon nitride layer and providing an opening in the mask;

etching the silicon nitride layer so that a first aperture is formed in the silicon nitride layer, and etching the silicon oxide layer so that a second aperture is formed in the silicon oxide layer;

wherein the silicon nitride layer comprises a side surface surrounding the first aperture, the silicon nitride layer side surface having a tapered shape with an angle in the range of 30 degrees to 60 degrees in relation to a surface of the pad, and the silicon oxide layer comprising a side surface surrounding the second aperture, the silicon oxide layer side surface having a tapered shape with an angle in the range of 60 degrees to 70 degrees in relation to the surface of the pad, wherein the angle of the silicon nitride layer side surface having a tapered shape is smaller than the angle of the silicon oxide layer side surface having a tapered shape; and wherein the etching the silicon nitride layer is controlled so as to allow the silicon oxide layer to be exposed beyond the area for the opening of the mask.

* * * * *